United States Patent [19]
Johnson, III et al.

[11] Patent Number: 5,187,479
[45] Date of Patent: Feb. 16, 1993

[54] BACKLASH COMPENSATION CIRCUIT FOR USE WITH AN INCREMENTAL ENCODER

[75] Inventors: David U. Johnson, III, New Carlisle; Charles J. Conner, Dayton; Peter A. Wolf, Piqua, all of Ohio

[73] Assignee: AM International Incorporated, Chicago, Ill.

[21] Appl. No.: 769,204

[22] Filed: Sep. 30, 1991

[51] Int. Cl.$^5$ .............................................. H03M 1/22
[52] U.S. Cl. .......................................... 341/6; 341/11
[58] Field of Search ................................ 341/6, 10, 11

[56] References Cited

U.S. PATENT DOCUMENTS

| | | | |
|---|---|---|---|
| 4,021,781 | 5/1977 | Salazar et al. | 341/13 |
| 4,194,184 | 3/1980 | Hartmann et al. | 341/6 |
| 4,266,215 | 5/1981 | Adams | 341/6 |
| 4,300,039 | 11/1981 | Avins | 341/6 X |
| 4,599,600 | 7/1986 | McGuire et al. | 341/6 |
| 4,965,816 | 10/1990 | Shih et al. | 377/17 |

*Primary Examiner*—Marc Hoff
*Attorney, Agent, or Firm*—Tarolli, Sundheim & Covell

[57] ABSTRACT

A circuit compensates backlash of a shaft on an incremental encoder having a quadrature and index pulse output lines. Quadrature is represented as two signal lines phased apart by 90 degrees and an index pulse occurring once per revolution of the encoder shaft. The logical combination of the quadrature signals produce a four state condition which, through sequential examination of the signal levels, allows discriminating circuitry to determine the rotational direction of the encoder shaft. The circuit allows the definition of clockwise or counterclockwise rotation as being the forward direction. When the circuit discerns the positive forward rotational progression of the two signal lines, the circuit passes such signals unaltered to a pulse responsive system. Upon discernment of an encoder's shaft reverse rotation, the circuit causes the last forward rotational quadrature state to be latched on its output lines. The current condition of the index pulse is latched and the incidence of reverse pulses in a counter circuit is accumulated. Upon detection of a return to a forward rotational direction, the circuit counts down the number of forward pulses sufficient to exhaust the contents of the counter circuit. When the accumulated reverse rotational pulses have been counted down to zero and the state of the encoder's output signal lines match that of the latched condition, the circuit releases the latch and allows passage of subsequent quadrature signals and the index pulse.

11 Claims, 2 Drawing Sheets

EQUATIONS
/REV := (/Q1 * /Q0 * /APAL * /SYNCB * /REV )
      + (/Q1 * /Q0 * APAL * /SYNCB )
      + (/Q1 * Q0 * /APAL * SYNCB * /REV )
      + (/Q1 * Q0 * /APAL * /SYNCB )
      + ( Q1 * /Q0 * APAL * /SYNCB * /REV )
      + ( Q1 * /Q0 * APAL * SYNCB )
      + ( Q1 * Q0 * APAL * SYNCB * /REV )
      + ( Q1 * Q0 * /APAL * SYNCB )

/CE := PWRUP * ( REV + (TC1 * /CE ) + TC2 + ( AOUT * /Q1 * /CE )
    + (BOUT * /Q0 * /CE ) + ( /AOUT * Q1 * /CE )
    + ( /BOUT * Q0 * /CE))
AOUT := ( CE * Q1 ) + ( /CE * AOUT )
BOUT := ( CE * Q0 ) + ( /CE * BOUT )
ACLK := /CE * ( TC1 + TC2 )
      * ((REV * APAL * SYNCB ) + (/REV * /APAL * SYNCB ))
      * ( ACLK * REV * APAL )
      * ( ACLK * /REV * /APAL )

/APAL = ( SYNCA * CCW ) + ( /SYNCA * /CCW )
STATE
S1 = /Q1 * /Q0    S1 := CON3 -> S3    S2 := CON1 -> S1    S3 := CON4 -> S4
S2 = /Q1 * Q0         + CON2 ->S2         + CON4 -> S4         + CON1 -> S1
S3 = Q1 * /Q0         + CON1 ->S1         + CON2 -> S2         + CON3 -> S3
S4 = Q1 * Q1          + CON4 ->S4         + CON3 -> S3         + CON2 -> S2

S4 := CON2 -> S2
    + CON3 -> S3
    + CON4 -> S4
    + CON1 -> S1

CON1 = (/APAL * /SYNCB * PWRUP) + (APAL * /SYNCB * /PWRUP)
CON2 = (/APAL * SYNCB * PWRUP) + (/APAL * /SYNCB * /PWRUP)
CON3 = (APAL * /SYNCB * PWRUP) + (APAL * SYNCB * /PWRUP)
CON4 = (APAL * SYNCB * PWRUP) + (/APAL * SYNCB * /PWRUP)

Fig.4

BACKLASH COMPENSATION CIRCUIT FOR USE WITH AN INCREMENTAL ENCODER

BACKGROUND OF THE INVENTION

1. Technical Field

The present invention relates to electronic circuitry contrived so as to allow the passage of an incremental encoder's signal when such encoder is mechanically driven in a forward rotation. The circuitry is further contrived so as to maintain or latch the last encoder state to its output upon detection of reverse rotation of the encoder as a condition of its mechanical application. Further, the circuitry inhibits the re-establishment of the forward rotational signal transitions to its output until a equal displacement of forward rotation offsets the total displacement of reverse rotation discerned by the circuit and the instantaneous encoder input state matches the latched output of the circuit. Further, the circuitry is contrived so as to inhibit the passage of the encoder's index pulse while the circuit's output lines are latched to a constant state. Such circuitry finds practical application in the control or monitoring of mechanical apparatus such as a collator conveyor predisposed to mechanical reverse travel from its intended motion.

2. Background Art

An incremental encoder translates the rotational motion of its shaft into two output signals exhibiting a phase difference of nominally ninety degrees. The signals' phase difference results in a presentation of four output states to discriminating circuitry intended to process the resultant signal. By discriminating the sequence of the presented quadrature signal, relative forward or reverse rotation may be discerned. Forward and reverse rotation within the context of this invention is relative and may be arbitrarily defined. An incremental encoder may be further contrived so as to supply an index pulse output to discriminating circuitry annunciating a complete revolution of the encoder's shaft. An incremental encoder provides transitional signals to host controls assisting in the synthesis of positional data of the controlled mechanism enabling various control functions of the mechanism.

A characteristic of mechanical systems driven by electric motors and constrained by brakes against varying mechanical loads is the disposition toward reverse motion. The direction of useful production is referenced herein as forward rotation. Functional control of the system is assisted by positional data derived from the monitoring and accumulation of pulses emanating from an incremental encoder which is mechanically coupled to the system. Further, various devices augmenting the processing features of the system may require precise positional data as exemplified by an ink jet printer situated along a collating conveyor.

The final quality of the product produced by such a processing system depends upon the containment of the effects of reverse line motion often described in mechanical systems as backlash. Processing controls also utilize positional data derived from totalized incremental encoder signals to track the forward progress of a product situated along the processing system. Mechanical backlash, improperly compensated, acts to reduce the quality of ink jet applied images as well as contributes to a loss of positional control of the product along the processing system. Inaccuracies in product tracking, resulting from improper backlash compensation or no backlash compensation, contribute to ineffective device control along the course of a collating conveyor. Systems relying on the proper presentation of the index pulse for positional control may become faulty as a result of multiple index pulse transitions produced by a reciprocating angular motion of the encoder shaft.

Electronic circuits for compensating mechanical backlash encountered by an incremental encoder having quadrature and index outputs are known. For example, a type of filter circuit may be located between the incremental encoder and the control circuitry t inhibit the passage of reverse direction signal sequences. In such a manner, only forward transitions are passed to the control circuitry. The output of the filter circuit is a single phase pulse train signal derived from the input quadrature sourced by the incremental encoder. Since the incremental encoder provides a quadrature source signal comprised of two discrete signal lines and appropriately phased, and the filter circuit provides a single output line to the controller, the integrity of the quadrature output of the encoder is lost when a filter circuit is employed. Further, such filter circuitry does not preserve the proper sequencing of the index pulse for encoders so equipped.

SUMMARY OF THE INVENTION

The present invention is directed to a circuit for conditioning electrical signals from an incremental encoder when the encoder's shaft is induced to rotate in a direction counter to normal operation of the controlled equipment. The invention is applicable to conditioning of an incremental encoder's quadrature and index output lines, and preserving the state and nature of the output lines through the conditioning process.

The present invention is embodied as an electronic circuit which discerns the quadrature state sequence of a relative forward or reverse rotation of an incremental encoder. Each sequential state is latched to the output of the circuit and allowed to transition, following the input quadrature signal, only when the circuitry discerns a forward rotation state sequence presented by the encoder. Although arbitrary in definition, the circuit allows clockwise or counterclockwise selection of the relative directional reference. Upon detection of a reverse rotation state sequence, the circuit latches the last detected forward rotational state and proceeds to count and totalize an accumulation of reverse rotation pulses. Similarly, the index pulse progression is blocked from the output of the circuit. Upon the detection of a restoration of forward rotation, the circuitry causes a decrement of the accumulated reverse rotational count until a zero state of the counter is realized.

Output of the transitional encoder signal is enable when the circuitry detects a match between the input encoder signal and the latched signal appearing at its output. Restoration of forward rotational signals also allows passage of the previously latched index pulse when such latched pulse is identical to the level appearing at the circuit's input.

BRIEF DESCRIPTION OF THE DRAWINGS

The foregoing and other features of the present invention will become apparent to one skilled in the art upon a consideration of the following description of the invention with reference to the accompanying drawings, wherein:

FIG. 4 represents a series of logic equations governing the state machine description of a programmable logic device illustrated in FIG. 3. The representation of the logic equations is recognizable by one skilled in the art.

DESCRIPTION OF PREFERRED EMBODIMENT

The present invention is directed to a circuit employed in the conditioning of electrical signals from an incremental encoder when the encoder's shaft is induced to rotate in a direction counter to normal operation of the controlled equipment. The circuit does not interfere with the output when the encoder is induced to rotate in the proper direction. The invention is applicable to the conditioning of an incremental encoder's quadrature and index pulse output lines, and preserving the state and nature of the lines through the conditioning process.

Figure 1:
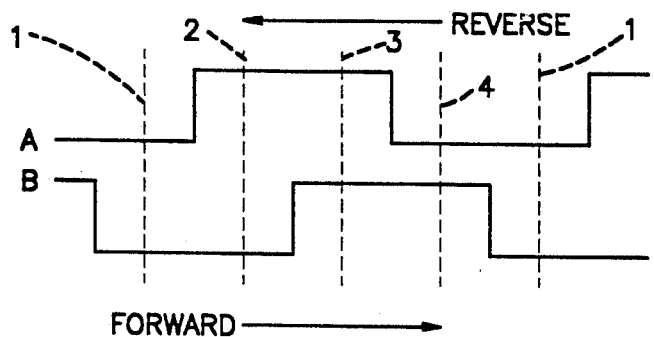
FIG. 1 is a representation of the electrical waveforms constituting the output signal elements of a typically applied incremental encoder.

FIG. 1 represents a diagram of the output voltage levels of the two signal lines originating from a typical incremental encoder employing quadrature encoding. The voltage levels, conditioned by common electronic circuitry and produced by the forward rotation of the encoder shaft, define four discrete states identified in FIG. 1 by states 1, 2, 3, and 4. A standard frame of rotational reference allows signal line A to electrically lead signal line B when the encoder shaft is constrained to rotate in a clockwise direction. For the purpose of illustration and keeping with industry practice, clockwise rotation of the encoder, while viewing the shaft end, is commonly interpreted as forward rotation. In such a fashion, the two signal lines, taken in combination, describe a type of binary code. The positive sequencing displacement provides discriminating electronic circuitry, such as the present invention, the means to determine rotational direction of the encoder's shaft. An encoder shaft constrained to rotate in a counterclockwise direction presents the above described output states in a reverse order, i.e., the states sequence 4, 3, 2, 1.

Figure 2:
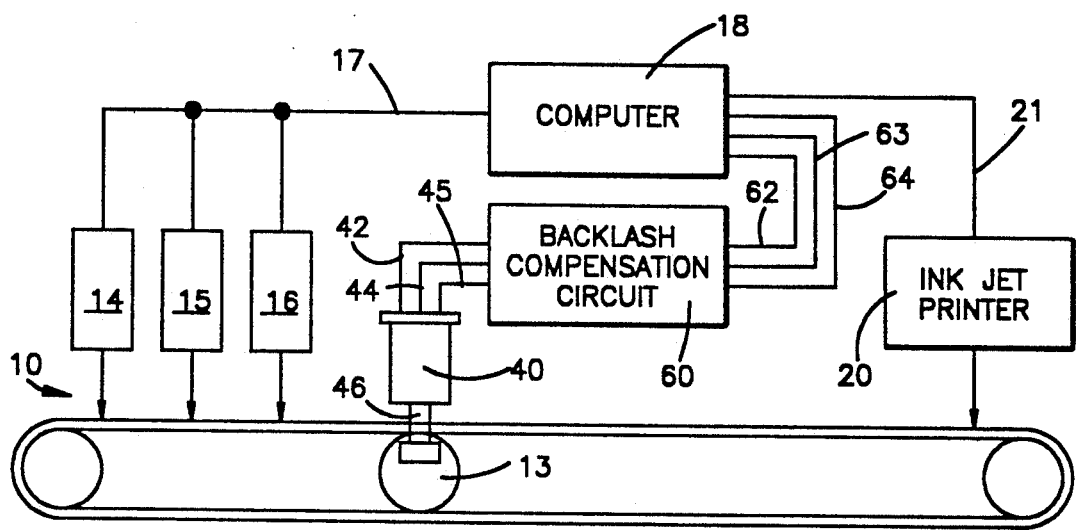
FIG. 2 is a schematic block diagram illustrating a collator embodying the present invention.

The specific construction and use of the present invention may vary. By way of example, the present invention is illustrated in FIG. 2 as embodied in a collator 10. The collator 10 includes a collating conveyor 12 and a number of hoppers for feeding signatures onto the conveyor 12. The actual number of hoppers may be any number of hoppers. For purposes of explanation only, three hoppers 14, 15 and 16 are illustrated in FIG. 2. The hoppers 14, 15 and 16 are controlled by signal lines 17 from a control computer 18.

The collator 10 also includes an incremental encoder 40 having a quadrature output on signal lines 42 and 44. The signal on each of the lines 42 and 44 is a regularly sequenced pulse train. The incremental encoder 40 has a shaft, designated by reference numeral 46 in FIG. 2, operatively coupled with a shaft 13 on the conveyor 12.

When the conveyor 12 moves in a forward direction, the shaft 13 on the conveyor 12, and hence the shaft 46 of the incremental encoder 40, rotates in one direction. By convention, a repetitive sequence of four states appears on the output lines 42 and 44 of the encoder 40 when the encoder's shaft 46 rotates in the forward direction of the collator 10. The arrangement and control of the various mechanical components comprising the collator 10 may, on occasion, cause the shaft 13 on the conveyor 12 to rotate in a reverse or unfavorable direction. Since the shaft 13 is operatively coupled with the encoder shaft 46, the shaft 13 mechanically transmits the reverse or unfavorable rotation to the encoder 40. Upon reverse rotation, the encoder 40 causes a sequential reversal of the quadrature state values appearing on the output lines 42 and 44 of the encoder 40.

A typical encoder appropriate to the art, may include a third output signal line 45. The third output signal line 45 presents a momentary pulse to discriminating circuitry marking a complete 360 degree revolution of the encoder shaft 46. Such a signal, commonly termed an index pulse and transmitted along line 45, is provided for manipulation under situations of reverse rotation of the encoder shaft 46.

A backlash compensation circuit 60 receives three signals on lines 42, 44 and 45 from the encoder 40 and provides a first quadrature output signal on signal line 62 and a second quadrature output signal on signal line 64. The manipulated index pulse signal is provided on output line 63 of the circuit 60. These signals are directed to the control computer 18.

Coincidental with the operation of the collator 10 is a typically situated ink jet printer 20 for printing of various indicia required of the production process. The computer 18 provides synchronization signals on line 21 required by printer 20. Although represented as a single line in FIG. 2, line 21 as well as line 17 may be manifested as a multiplicity of signal lines.

During production processing, it is desirable to maintain the print quality of the ink jet printer 20. This quality is compromised if the encoder shaft 46 is constrained to reverse rotation without the benefit of the present invention in providing the output lines 62 and 64 to the control computer 18. In such an event, the control computer 18 would pass to the ink jet printer 20 a forward synchronization signal on signal line 21 even though the actual indicia was reversely directed.

Figure 3:
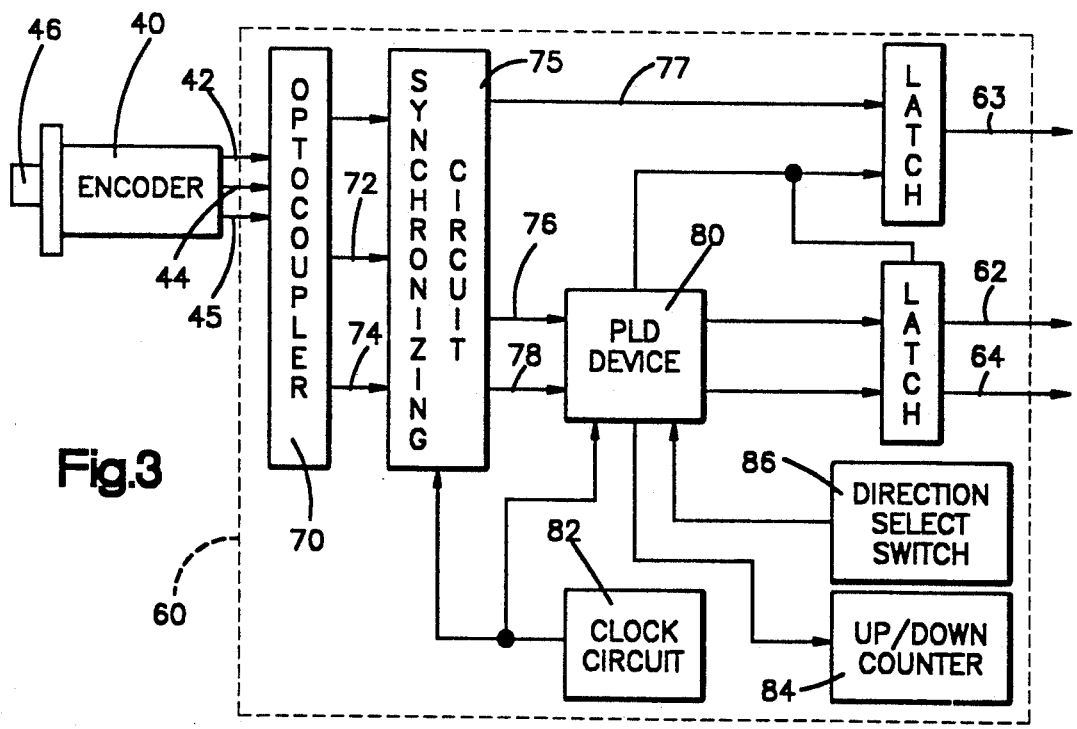
FIG. 3 is a portion of FIG. 2 and is a schematic block diagram illustrating a backlash compensation circuit constructed in accordance with the present invention.

Referring to FIG. 3, details of the backlash compensation circuit 60 are illustrated. The circuit 60 includes an optocoupler device 70 which optically couples the electrical output signals on lines 42 and 44 from the encoder to other circuitry of the circuit 60. The optocoupler 70 is provided in the circuit 60 to ensure electrical isolation from high voltages potentially hazardous to the operation of the circuit 60. Since optocoupler devices are known and readily available in the marketplace, their structure and operation will not be described. The circuit 60 further includes a single programmable logic device 80, hereinafter PLD, and a synchronizing circuit 75 connected between the optocoupler device 70 and the PLD 80. The synchronizing circuit 75 and the PLD 80 are each controlled in response to electrical pulses emitted from a clock circuit 82.

FIG. 4 illustrates a set of logic equations appropriate to the programming of the PLD 80. The equations define the logic relationships between the input signals and those defined as output signals of the PLD 80. Since programmable logic devices are known and readily available in the marketplace, their construction and structure will not be described.

A manually operated direction select switch 86 is connected to the PLD 80 and is used to allow the selection of the referenced forward direction of the circuit 60 as either clockwise or counterclockwise rotation of the shaft 46 of the encoder 40. The synchronizing circuit 75 typically includes D-type flip-flops (not shown) through which the signals on lines 72 and 74 are clocked and synchronized and provided on signal lines 76 and 78 to the PLD 80. The signals on lines 76 and 78 are synchronized to the PLD 80 to eliminate potential metastability problems typically associated with asynchronous logic designs.

The PLD 80 uses the synchronized signals on lines 76 and 78 to determine the direction of rotation of the shaft 46 of the encoder 40. If the state transitions of these signal lines are found to comply with the direction reference as set on switch 86, the signals on lines 76 and 78 are passed through the PLD 80 to lines 62 and 64, respectively. If reverse rotation of the shaft 46 is discerned by the PLD 80, through a sequential analysis of the state sequencing of the quadrature input signal lines 76 and 78, the last state of the signals on lines 62 and 64, just prior to the rotation of the shaft 46 of the encoder 40 in the reverse direction, is latched to the output lines 62 and 64, respectively. Coincidentally, a bidirectional counter, in the form of an up/down counter 84, is enabled and accumulates the number of reverse rotation pulses associated with the signals on lines 76 and 78.

When forward rotation is restored to shaft 46, the count accumulated in the reverse direction and held in the up/down counter 84 decrements on each forward direction pulse on signal lines 76 and 78. While the up/down counter 84 is being decremented by the forward direction pulses, the output signals on lines 62 and 64 remain latched in the last discerned forward direction state immediately before the reversed motion was detected by the circuit 60.

An index pulse produced by the encoder 40 on line 45 during this compensation period will not be passed to the output line 63 of the circuit 60. Upon detection of reverse rotation of the encoder shaft 46 or during the period of pulse compensation, the index pulse originating from the incremental encoder 40 is latched to the last state prior to reverse rotation and is shunted on signal line 77 and prevented from asserting itself on output line 63.

If, while in the process of compensating for accumulated reverse pulses, the circuit 60 detects a return to the reverse direction, the accumulated count of pulses contained within the up/down counter 84 is made to increment further as the progression of reverse pulses is detected by the circuit 80. During the compensation period, the output signals on lines 62 and 64 remain latched in the last discerned forward direction state immediately before the reverse motion was detected by the circuit 60.

The compensation period of the circuit is concluded when the accumulated reverse rotation pulses contained in the up/down counter 84 is counted down by the detection of a corresponding number of forward pulses. The circuit 60 requires the quadrature state of the last compensated signal pulse to be identical to that which was latched onto the output lines 62 and 64 before releasing the lines of the latched encoder state and allowing the subsequent passage of forward encoder pulses across the output lines of the circuit 60. Additionally, the latched index pulse 63 will be released when the latched index pulse state is identical to that presented to the circuit's input line 45. In such a fashion, the sequential integrity of the encoder's output, as manifest by the output of the circuit 60, is preserved to any pulse responsive system employing such signals.

It should be apparent that the PLD 80, as a condition of its programming, "freezes" the last forward signal state on signal lines 62 and 64 just prior to reverse rotation of the shaft 46 and inhibits the signals on lines 76 and 78 from passing to lines 62 and 64 whenever the PLD 80 detects reverse rotation of the shaft 46. The PLD 80 continues holding the last state of the signals on lines 62 and 64 as well as inhibits the passage of any subsequent index pulses on line 63 just prior to reverse rotation of the shaft 46 and continues inhibiting the progression of the signals onto the output lines 62, 63 and 64 until the shaft 46 has moved an amount of pulses in the forward direction equal to the amount of reverse pulses accumulated in the up/down counter 84 and the signal input state is identical to the latched output state.

By using the circuit 60 to compensate the quadrature output o lines 42 and 44 and the index pulse 45 of the encoder 40 in the manner as described hereinabove, a number of advantages result. One advantage is that the integrity of the quadrature output of the encoder 40 is maintained and not lost during the compensation process. The integrity is not lost because the circuit 60 provides two output signals on lines 62 and 64 corresponding to the signals on lines 42 and 44 directly from the encoder 40. When the integrity of the quadrature output of the encoder 40 is maintained and not lost during the compensation process, the encoder 40 in combination with the circuit 60 can be used in many different applications without requiring any special interface circuitry between the encoder 40 and a device to be controlled by the encoder 40.

Another advantage in using the circuit 60 in combination with the encoder 40 is that the encoder 40 does not have to be modified to be made compatible with the circuit 60. This means that any conventional incremental encoder having a quadrature and optional index pulse output can be used with the circuit 60.

The circuit 60 described hereinabove is separate from the encoder 40. However, it is conceivable that the circuit 60 may be embedded in the encoder 40. For example, the circuit 60 may be disposed in a housing of the encoder 40.

From the above description of the invention, those skilled in the art will perceive improvements, changes and modifications. Such improvements, changes and modifications within the skill of the art are intended to be covered by the appended claims.

Having described the invention, the following is claimed:

1. A circuit for electronically compensating the mechanical backlash associated with the electrical signals of an incremental encoder having a quadrature output in which one output signal is a first pulse train and the other output signal is a second pulse train, the characteristics of such output signals being that the first output signal leads the second output signal and, when taken in combination, a progression of four output conditions are sequentially presented to discriminating circuitry allowing same to detect a forward or reverse rotation of a shaft of the encoder, said circuit comprising:

means for providing the a rotational directional reference on which to determine forward or reverse shaft motions;

counting means for accumulating the integral number of pulses detected while the encoder is constrained to rotate in the reverse direction, and for the depletion of the accumulated counts upon said circuit detecting a resumption of forward rotation; and control means for (i) discriminating forward and reverse rotation of the encoder shaft by the analysis of state progressions provided by the two output signals of the encoder, (ii) latching the quadrature output and index pulse of the incremental encoder upon detection of reverse rotation of the encoder shaft to those values immediately before such detection, and (iii) releasing such latched outputs of the incremental encoder upon depletion of accumulated reverse rotation pulses and an encoder output state identical to the latched state, said control means blocking passage of the first and second pulse trains and index pulse output from the incremental encoder to a pulse responsive system when the encoder shaft rotates in the reverse direction.

2. A circuit as defined in claim 1 wherein said rotational direction reference is established at the point of application of said circuit defining to other circuit elements the intended rotational reference of the application.

3. A circuit as defined in claim 1 wherein said control means includes a single programmable logic device electrically coupled with said counting means, the control logic allowing the discernment of the rotational quality of the output signals of the incremental encoder and providing discernment, manifested electrically, to elements of said circuitry requiring such information.

4. A circuit as defined in claim 3 further including synchronizing means for synchronizing the first and second pulse trains to said single programmable logic device and clocking means electrically coupled with said synchronizing means and said programmable logic device for providing timing pulses to synchronize the first and second pulse trains from the incremental encoder to said single programmable logic device.

5. A circuit as defined in claim 1 wherein said counting means include a bidirectional counter which results in a positive accumulation of pulse counts in response to said circuit detecting reverse encoder shaft rotational pulses and depletes said accumulated count when said circuit discerns a restoration of forward rotation pulses as originating from the encoder.

6. A circuit as defined in claim 5 wherein the quadrature output lines of the incremental encoder are latched to the output lines of said circuit in the last discerned forward rotational direction and thereby effectively blocking, to a pulse responsive system, any reverse rotation signals which may emanate from the incremental encoder.

7. A circuit as defined in claim 5 wherein the index pulse line of the incremental encoder is latched to the corresponding output line of said circuit in the last discerned forward rotational direction and thereby effectively blocking, to a pulse responsive system, any reverse rotation signals which may emanate from the incremental encoder.

8. A circuit as defined in claim 5 wherein the input lines of said circuit are compared with the quality of the latched state to test the identity of the input state.

9. A circuit as defined in claim 5 wherein the quadrature output lines of the incremental encoder are unlatched from the output lines of said circuit in the last discerned forward rotational direction and thereby effectively releasing, to a pulse responsive system, any forward rotation signals which may emanate from the incremental encoder after having been restored to rotation in the forward referenced direction.

10. A circuit as defined in claim 5 wherein the index pulse line of an incremental encoder is unlatched from the corresponding output line of said circuit in the last discerned forward rotational direction and thereby effectively restoring, to a pulse responsive system, any forward rotation signals which may emanate from the incremental encoder after having been restored to rotation in the forward referenced direction.

11. A circuit as defined in claim 1 further including means for optically isolating the first and second pulse train output signals and index pulse output signal emanating from the incremental encoder.

* * * * *